(12) United States Patent
Kuo et al.

(10) Patent No.: US 11,928,413 B2
(45) Date of Patent: Mar. 12, 2024

(54) APPARATUS AND METHOD FOR GENERATING A PARAMETERIZED WAVEGUIDE OPTICAL ELEMENTS

(71) Applicant: Taiwan Semiconductor Manufacturing Co., Ltd., Hsin-Chu (TW)

(72) Inventors: Feng-Wei Kuo, Zhudong Township, Hsinchu County (TW); Wen-Shiang Liao, Miaoli County (TW)

(73) Assignee: Taiwan Semiconductor Manufacturing Co., Ltd., Hsin-Chu (TW)

( * ) Notice: Subject to any disclaimer, the term of this patent is extended or adjusted under 35 U.S.C. 154(b) by 582 days.

(21) Appl. No.: 17/162,912

(22) Filed: Jan. 29, 2021

(65) Prior Publication Data
US 2022/0245321 A1 Aug. 4, 2022

(51) Int. Cl.
| G06F 30/392 | (2020.01) |
| G02B 27/00 | (2006.01) |
| G05B 19/18 | (2006.01) |
| G06F 30/39 | (2020.01) |
| G06F 30/394 | (2020.01) |
| G06F 30/398 | (2020.01) |
| G02B 6/122 | (2006.01) |
| G02B 6/124 | (2006.01) |

(52) U.S. Cl.
CPC ....... *G06F 30/392* (2020.01); *G02B 27/0012* (2013.01); *G05B 19/188* (2013.01); *G06F 30/39* (2020.01); *G06F 30/394* (2020.01); *G06F 30/398* (2020.01); *G02B 6/1228* (2013.01); *G02B 6/124* (2013.01); *G05B 2219/45026* (2013.01)

(58) Field of Classification Search
CPC .................................................. G06F 30/392
USPC ...................................................... 716/119
See application file for complete search history.

(56) References Cited

U.S. PATENT DOCUMENTS

2020/0003970 A1* 1/2020 Marchetti ............ G02B 6/4215

* cited by examiner

*Primary Examiner* — Eric D Lee
(74) *Attorney, Agent, or Firm* — Duane Morris LLP

(57) ABSTRACT

A method and system for generating a physical layout for a grating coupler integrated in a photonically-enabled circuit are disclosed herein. In some embodiments, the method receives a parametrized wavelength, a parametrized first refractive index, a parametrized second refractive index, a parametrized taper length, a parametrized width, a parametrized grating length, and a parametrized incident angle of the optical beam incident onto the grating coupler and generates a physical layout for the grating coupler based on the received parametrized inputs, the generating of the physical layout is according to a predefined model, and outputs the physical layout of the grating coupler for manufacturing under a semiconductor fabrication process.

20 Claims, 7 Drawing Sheets

APPARATUS AND METHOD FOR GENERATING A PARAMETERIZED WAVEGUIDE OPTICAL ELEMENTS

BACKGROUND

Photonic integration is a key technology for future advancement in optical communication technology. Scaling down of the optical building elements enables cost-effective, complex and ultra-compact photonic circuits, i.e. chips which comprise integrated optical components formed on or in a substrate and which are interconnected by planar waveguides. It is typically desirable to be able to optically couple the signals conducted by such planar waveguides into or out of the integrated chip, for example from or into an optical fiber.

These planar waveguides are advantageous because they can be compactly incorporated together in or on a planar platform, i.e. semiconductor substrate, to form planar packages analogous to integrated circuits (ICs). Planar waveguides analogous to conductor traces in semiconductor electronic ICs that are mounted in or on the substrate are employed to guide light to various optical, electro-optical, and optoelectronic devices or components on the chip.

In many applications, it is desirable that the optical signal being transmitted through the planar waveguide structures be optically coupled into or out of the integrated optical chip. One possible solution is a grating coupler which is a periodic structure that couples light out of the chip, e.g. to free space or to an optical fiber. In integrated silicon photonic circuits, designers layout the geometrical structures of optical elements such as the grating couplers before fabrication.

Electronic Design Automation (EDA) tools and methods are often used in the design and placement of silicon photonically-enabled integrated circuits on a semiconductor wafer. This enables EDA tools designers of silicon photonic circuits to create a first-time-right design for extremely complex integrated circuits with billions of components. In many applications, the layout geometries for optical elements of silicon photonically-enabled integrated circuits may be based on reflection, coupling efficiency, communication bandwidth, communication channel, modulation schemes, taper angle and widths, etc. However, current methods and systems that provide the layout geometries for optical elements fail to optimize for various design characterizations. Moreover, current methods and systems for generating layout of optical elements do not provide a parameterized optical element layout generating techniques that can be defined using a variety of scripting languages such as SKILL, Ample, STP, Python, or Tcl. In fact, current method merely provide a database of hand drown complex curved shapes of optical elements optimized for a particular design characteristics (e.g., low reflectivity).

Therefore, a scalable system and method is needed for an automated and parameterized (PCell) optical element generation of based on desired design characteristics. In particular, a scalable system and method is needed for generating parameterized curved patterns in optical grating couplers.

The information disclosed in this Background section is intended only to provide context for various embodiments of the invention described below and, therefore, this Background section may include information that is not necessarily prior art information (i.e., information that is already known to a person of ordinary skill in the art). Thus, work of the presently named inventors, to the extent the work is described in this background section, as well as aspects of the description that may not otherwise qualify as prior art at the time of filing, are neither expressly nor impliedly admitted as prior art against the present disclosure.

BRIEF DESCRIPTION OF THE DRAWINGS

Various exemplary embodiments of the present disclosure are described in detail below with reference to the following Figures. The drawings are provided for purposes of illustration only and merely depict exemplary embodiments of the present disclosure to facilitate the reader's understanding of the present disclosure. Therefore, the drawings should not be considered limiting of the breadth, scope, or applicability of the present disclosure. It should be noted that for clarity and ease of illustration these drawings are not necessarily drawn to scale.

DETAILED DESCRIPTION

Various exemplary embodiments of the present disclosure are described below with reference to the accompanying figures to enable a person of ordinary skill in the art to make and use the present disclosure. As would be apparent to those of ordinary skill in the art, after reading the present disclosure, various changes or modifications to the examples described herein can be made without departing from the scope of the present disclosure. Thus, the present disclosure is not limited to the exemplary embodiments and applications described and illustrated herein. Additionally, the specific order and/or hierarchy of steps in the methods disclosed herein are merely exemplary approaches. Based upon design preferences, the specific order or hierarchy of steps of the disclosed methods or processes can be re-arranged while remaining within the scope of the present disclosure. Thus, those of ordinary skill in the art will understand that the methods and techniques disclosed herein present various steps or acts in a sample order, and the present disclosure is not limited to the specific order or hierarchy presented unless expressly stated otherwise.

Figure 1:
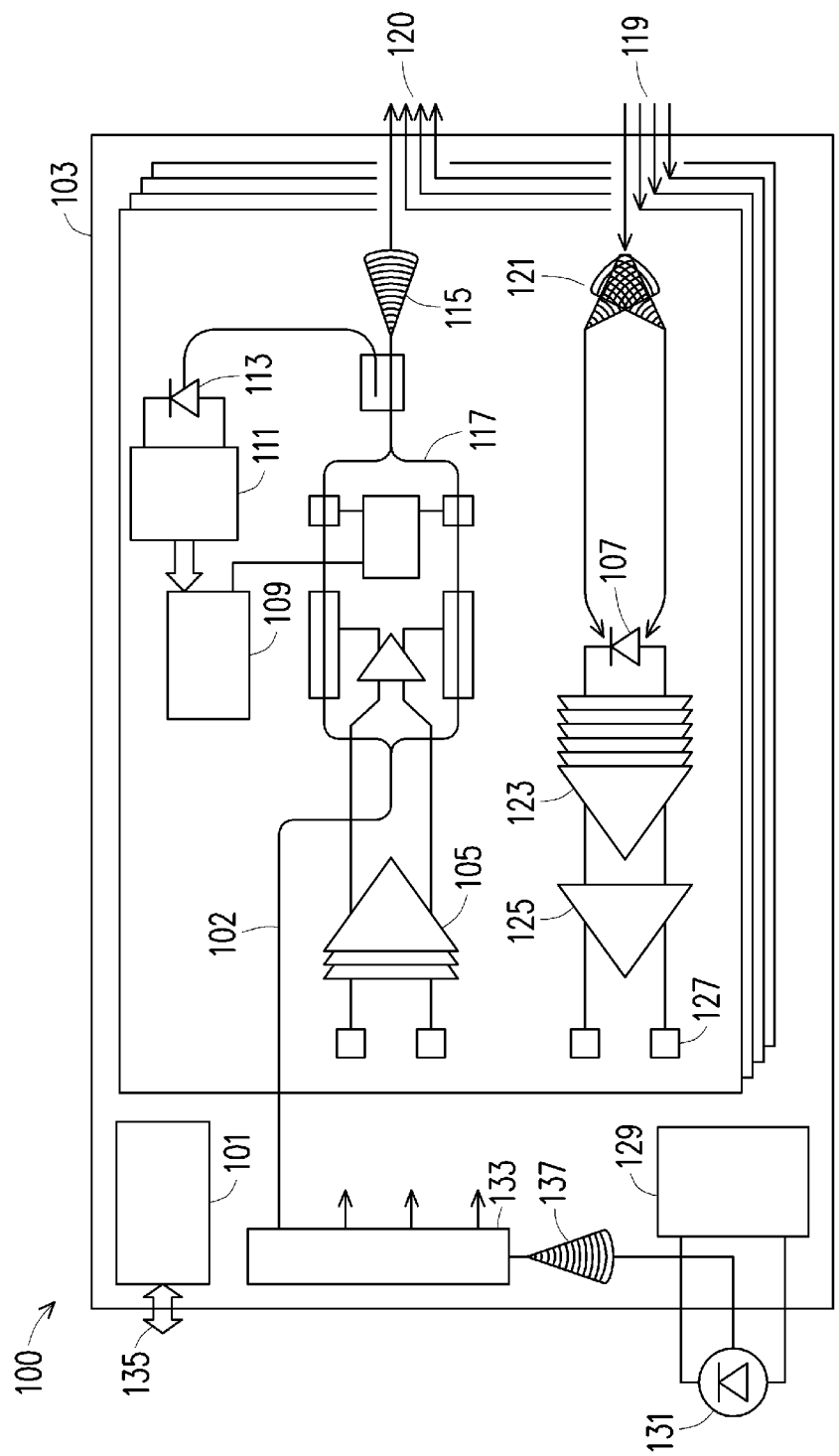
FIG. 1 is a schematic illustrating an exemplary optical transceiver, in accordance with some embodiments.

As illustrated in FIG. 1, the exemplary optical transceiver 100 may include optical modulators 117, monitor photodiode 113, and optical grating couplers 115 and 121. The exemplary optical transceiver 100 may also include electrical devices and circuits comprising amplifiers 105 and 123, an analog to digital converter circuit 111, a digital control circuit 101, a photodiode(s) 107 and control section 109. The amplifiers 105 and 123 may comprise transimpedance and limiting amplifiers (TIA/LAs), for example. In some embodiments, the exemplary optical transceiver 100 may further comprise a photonics die 103 with a laser assembly. In some embodiments, the laser assembly may comprise one or more semiconductor lasers 131, lenses, rotators for directing one or more continuous-wave (CW) optical signals, and one or more laser driver 129.

In further embodiments, the exemplary optical transceiver 100 may include couplers 137 that are configured to receive an optical signal from the laser 131 and an optical splitter 133 that is configured to split the optical signal into four roughly equal power optical signals. In various embodiments, the split power signals may be transmitted from the optical splitter 133 to the optical modulators 117 through optical waveguides. In some embodiments, the optical splitter 133 may be coupled to at least one input waveguide 137 and at least four output waveguides 102. In some embodiments, the optical splitter 133 may comprise a low-loss Y-junction power splitters. In some embodiments, the at least one input waveguide 137 may comprise a single polarization grating coupler (SPGC).

In some embodiments, the optical modulators 117 may comprise Mach-Zehnder or ring modulators, for example, and enable the modulation of the continuous-wave (CW) laser input signal. The optical modulators 117 may also comprise high-speed and low-speed phase modulation sections and are controlled by the control sections 109. In some embodiments, at least one of outputs of each of the optical modulators 117 may be optically coupled to an optical output 120 such as an optical fiber via the grating coupler 115. In some embodiments, the grating coupler 115 may comprise a single polarization grating coupler (SPGC). The other outputs of the optical modulators 117 may be optically coupled to the monitor photodiode 113 that is configured to provide a feedback path from the output of the optical modulators 117 to the section control 109.

Furthermore, the exemplary optical transceiver 100 may also utilize a grating coupler 121 for receiving optical signals from optical inputs 119. In other embodiments, the grating coupler 121 may comprise single polarization grating couplers (SPGC) and/or polarization splitting grating couplers (PSGCs). In instances where a PSGC is utilized, two input, or output, waveguides may be utilized.

In some embodiments, the exemplary optical transceiver 100 employs the photodiode(s) 107, which may be implemented with epitaxial germanium/SiGe films deposited directly on silicon. In other embodiments, photodiode(s) 107 may comprise high-speed heterojunction phototransistors, for example, and may comprise germanium (Ge) in the collector and base regions for absorption in the 1.3-1.6 μm optical wavelength range, and may be integrated on a CMOS silicon-on-insulator (SOI) wafer. The photodiode(s) 107 may be configured to convert optical signals received from the PSGCs 121 into electrical signals that are communicated to a receiver (Rx) 123 which may be configured to combine data streams, and demultiplex the received optical signals. Furthermore, received optical signals may be amplified by a transimpedance amplifier 125, for example, and subsequently communicated to a small form-factor pluggable (SFP) interface circuitry 127.

In some embodiments, the exemplary optical transceiver 100 may also include a digital control circuit 101 coupled to a serial interface 135 and configured to communicate received optical data through the serial interface 135.

As shown in FIG. 1, grating couplers 115 and 121 of the optical transceiver 100 enable coupling of light into and out of the integrated circuit comprising the optical transceiver 100. In some embodiments, the geometry parameters of the grating couplers 115 and 121 may be parametrized during the routing and layout of the photonically-enabled integrated circuit and optimized based on the performance index.

Figure 2A:
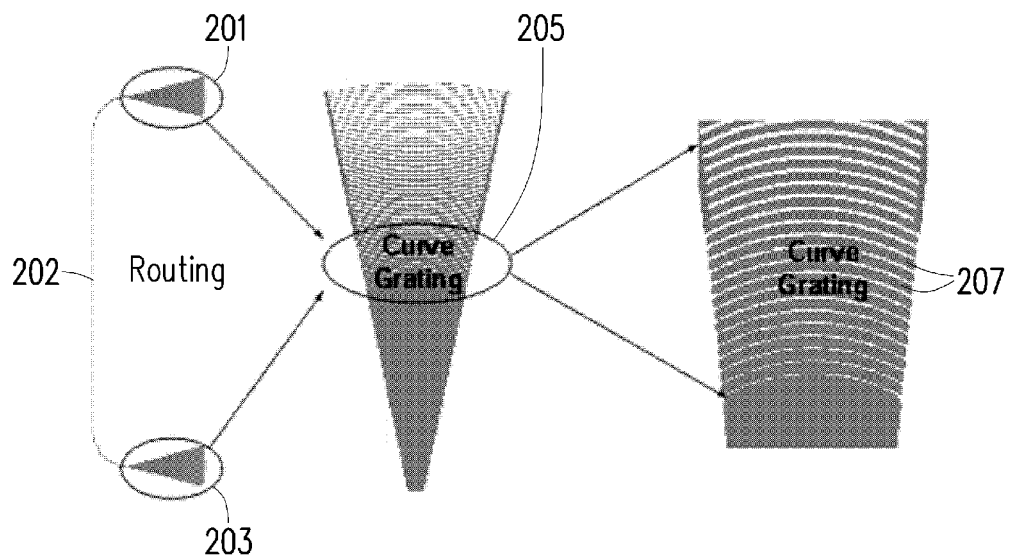
FIG. 2A illustrates top layout views of a single polarization grating coupler (SPGC) integrated in a photonically-enabled integrated circuit that couples light between a planar waveguide on the integrated optical chip and an optical fiber, in accordance with some embodiments.

As such, FIG. 2A illustrates top layout views of a single polarization grating coupler (SPGC) integrated in a photonically-enabled integrated circuit. In some embodiments, transmit or receive optical paths of the optical transceiver 100 may include an optical waveguide 202 having a first and second grating couplers 201 and 203 connected to both sides of the optical waveguide 202. The two grating couplers 201 and 203 may also be referred to as a grating coupler pair. In some embodiments, the first coupler 201 may be configured for the transverse electric (TE) mode and the second coupler 203 may be configured for the transverse magnetic (TM) mode.

FIG. 2A also illustrates a top view 205 of a grating assembly of one of the first or second grating couplers 201 and 203 having flared end and a plurality of elongate scattering elements, i.e., rulings or grates 207 configured to transform the wavefronts from planes of small dimension to plane waves of larger dimension or vice versa. In some preferred embodiments these scattering elements 207 may be elliptically shaped to assist above mentioned transformation. In some embodiments, as shown in FIG. 2A, a portion of these elongate scattering elements or grates 207 are segmented.

Figure 2B:
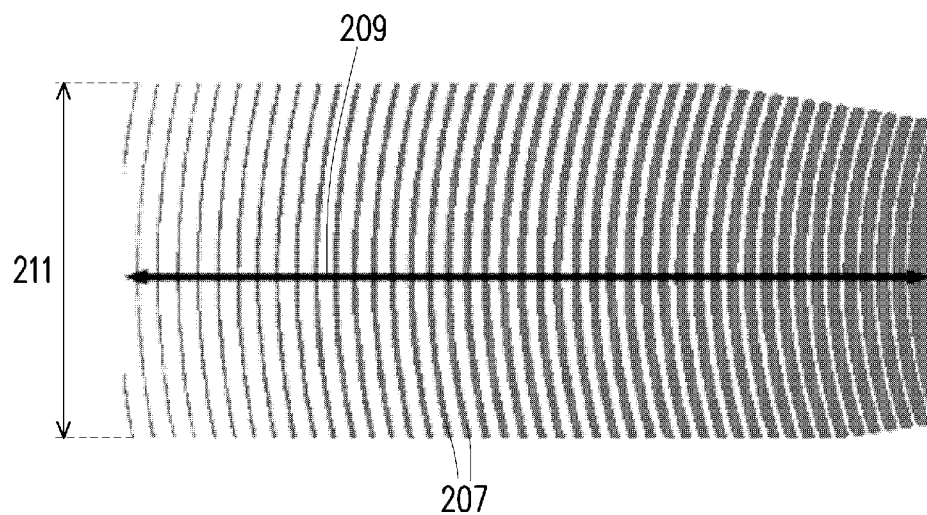
FIG. 2B illustrates top view of a grating assembly for the case where the scatter cross-section varies in width, in accordance with some embodiments.

FIG. 2B illustrates a top view of the grating assembly 205 for the case where the scatter cross-section varies in width, in accordance with some embodiments. In some embodiments, the dimension 211 of the grating assembly 205 may be parametrized to yield wavefronts between a grating coupler and an optical fiber having an intensity profile compatible with the dimensions of the optical fiber. In some embodiments, the elongated scattering elements or grates 207 may have widths that increase or decrease progressively. In some embodiments, the progressive widths of the grates 207 may be parametrized. Furthermore, the length 209 of the grating assembly 205 may also be parametrized. As such, the dimension 211 (weight), progressively varying width of the grates 207, and the widths 209 of the grating assembly 205 may be selected as a parameter to vary in order to achieve the desired geometry of the grating coupler that results in an optimal performance index.

Although one dimensional SPGCs shown in FIGS. 2A and 2B can achieve an efficiency close to unity, SPGCs work for one wave polarization. In some embodiments, two-dimensional orthogonal-positioned PSGCs can receive both polarizations from the optical input fiber 119.

Figure 3A:
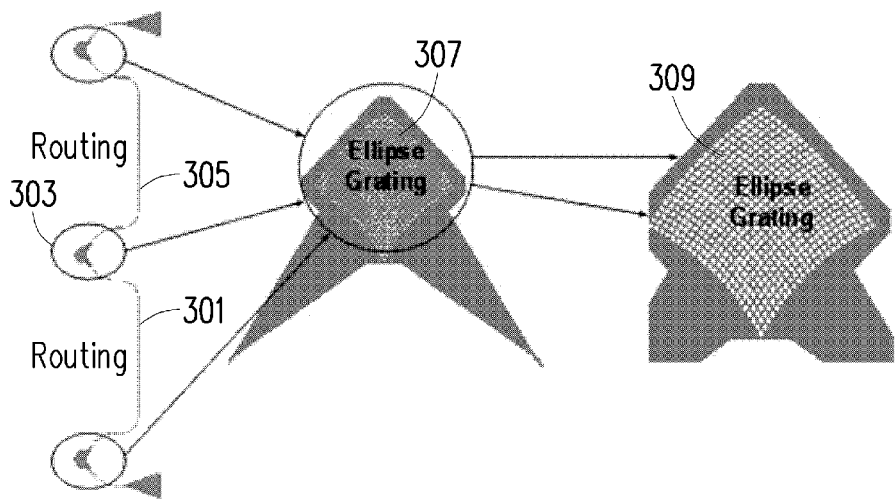
FIG. 3A is a top view of a 2D polarization splitting grating coupler for simultaneously coupling two polarization components of an out-of-plane, optical beam with two integrated waveguides, in accordance with some embodiments.

FIG. 3A illustrates top layout views of a 2D grating coupler 303 for simultaneously coupling two polarization components, optical beam with two integrated waveguides, in accordance with some embodiments. In some embodiments, the two integrated waveguides (a first integrated waveguide 301 and a second integrated waveguide 305) may be a planar silicon waveguides fabricated on an integrated circuit. In some embodiments, the structure of the 2D grating coupler 303 may separate two polarizations (e.g., TE and TM) from the received optical signal and forward each into the first and second waveguides 301 and 305. In some embodiments, the exemplary optical transceiver 100 may include a plurality of the 2D grating couplers with a pair of respective waveguides routed on the integrated circuit of the exemplary optical transceiver 100. In further embodiments, each of the polarizations of the received optical beam may be separately processed in the respective waveguides.

In an embodiment, an out-of-plane, optical beam, may be directed towards a 2D grating coupler 303 at a predefined incident angle (e.g., 15°) with respect to a normal to the grating coupler surface. In some embodiments, the incident optical beam may include two orthogonal linear polarization components. The 2D grating coupler 303 may include a 2D grating element 307 configured to separate the orthogonal polarization components and having an array of octagonal holes 309 (or alternatively an array of posts (not shown)). In some embodiments, an array of rectangular holes or posts may be used alas they are harder to fabricate using optical lithography than octagonal holes. In an embodiments, the 2D grating element 307 can be formed at an intersection of a pair of one dimensional SPGCs. In other embodiments, the period of the octagonal holes in the array 309 may be parametrized and thus, optimized based on a performance matric of a desired application. Moreover, in some embodiments, a perimeter and the geometric shape of the 2D grating element 307 may be parametrized and optimized based on a performance matric of a desired application.

Figure 3B:
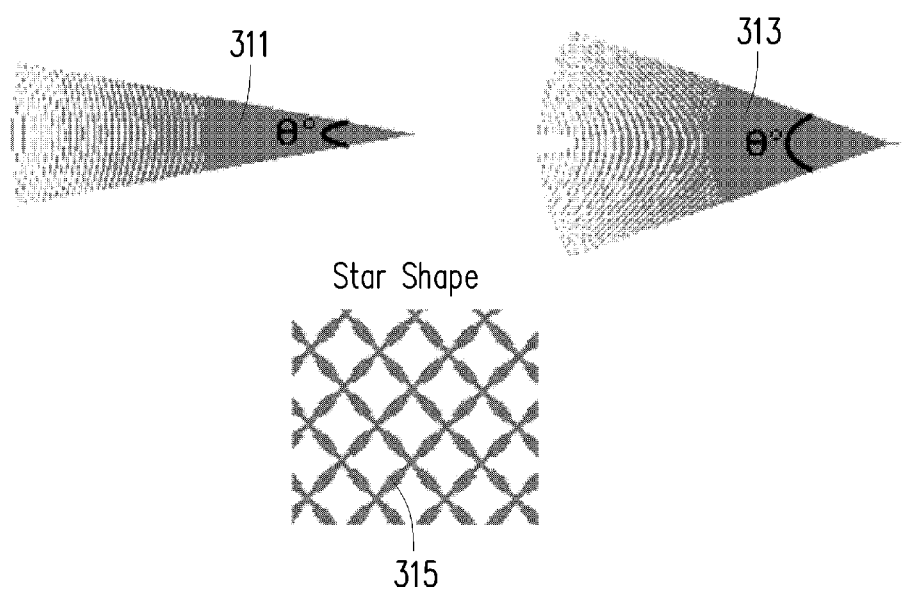
FIG. 3B illustrates a top view of a plurality of grating elements of the grating coupler.

In some embodiments, the taper angle of the one dimensional SPGC that forms the 2D grating couplers 303 may be parametrized and selected based on a performance matric of a desired application. For example, as shown in FIG. 3B taper angles 311 and 313 of the grating couplers may be parametrized. In some embodiments, the taper angles may be parametrized using the width 211 and/or the length 209 of the grating couplers.

In some embodiments, in order to reduce the polarization dependent loss (PDL) of the 2D grating couplers, a diamond-like grating lattice 315 may be used as shown in FIG. 3B. In this embodiments, grating cells include crossing ellipses which are orthogonal to each other. In some embodiments, the dimensions, number, and vertical arrangement of the crossing ellipses may be parametrized and selected based on a performance matric of a desired application.

Figure 4A:
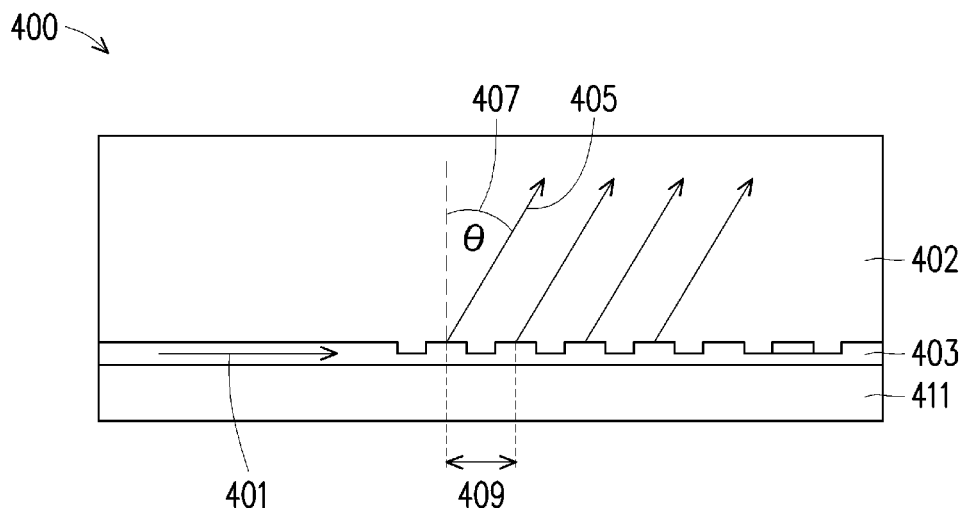
FIG. 4A is a schematic cross-section view of a single polarization grating coupler, in accordance with some embodiments.

FIG. 4A is a schematic cross-section view of a 1D grating coupler 400 for coupling a single polarization component of an out-of-plane, optical beam with a waveguide polarization mode. In some embodiments, the 1D grating coupler 400 may comprise a substrate 411. In some embodiments, the substrate 411 may be a silicon (Si) substrate used in the fabrication of integrated circuits. In an embodiment, an integrated waveguide 401 may be formed on the substrate 411 and may be surrounded by a cladding layer 402 formed on the integrated waveguide 401. In some embodiments, the cladding layer 402 may be formed from $SiO_2$. In other embodiments, a core region containing the integrated waveguide 401 may have a refractive index $n_{eff}$ while the cladding layer 402 may have a refractive index $n_{cladding}$. The refractive index of the core region containing the integrated waveguide 401 may be greater than the refractive index of the cladding layer 402.

In an embodiments, the disclosed 1D grating coupler 400 may comprise a plurality of grating elements 403. In some embodiments, the plurality of grating elements 403 may be configured to couple an out-of-plane, received or transmitted optical beam 405 with the integrated waveguide 401. In an embodiment, out-of-plane, optical beam 405 may couple with the plurality of grating element 403 via free-space propagation and/or an optical fiber. In some embodiments, the cross-sectional width of the plurality of grating elements 403 may be parametrized and selected based on a performance matric of a desired application. As shown in FIG. 4A, the out-of-plane optical beam may be incident at an incident angle θ 407 and the plurality of grating elements 403 may be separated according to a period 409. In some embodiments, the period 409 may vary and may be selected based on a performance matric of a desired application.

In some embodiment, the out-of-plane optical beam incident on the grating elements 403 may be coupled with the corresponding waveguide 401 when $$\sin\theta = \frac{n_{eff} - \frac{m\lambda}{a}}{n_{cladding}} \quad (1)$$

where $n_{cladding}$ is the refractive index of the cladding 402, θ is the incident angle 407, $n_{eff}$ is the refractive index of the integrated waveguide 401, λ is a wavelength of the incident out-of-plane optical beam, a is the grating period 409, and m is an integer representing the diffraction order (equals to 1 for 1D grating couplers). In some embodiments, process variations of one or more structural parameters of the plurality of grating elements 403 such as the period 409 or the width of the of grating elements 403 may result in a shift of $n_{eff}$. In turn, the shift in $n_{eff}$ may result in a coupling mismatch between the out-of-plane optical beam and the integrated waveguide 401. In some embodiments, the plurality of grating elements 403 may have a parametrized period and/or width selected based on a performance matric of a desired application. In some embodiments, a parametrized variants of physical layouts of 1D grating couplers 400 may be generated based on the parametrized period and/or width. In some embodiments, various physical layout instances/variants of the 1D grating coupler 400 may be generated based on the parametrized values of the period and/or width.

One exemplary advantage of parametrizing the physical layout of the 1D grating coupler 400 is reduced memory resource needed to represent the design data. Moreover, of parametrizing the physical layout of the 1D grating coupler 400 allows for an effective reduction of layout time.

Figure 4B:
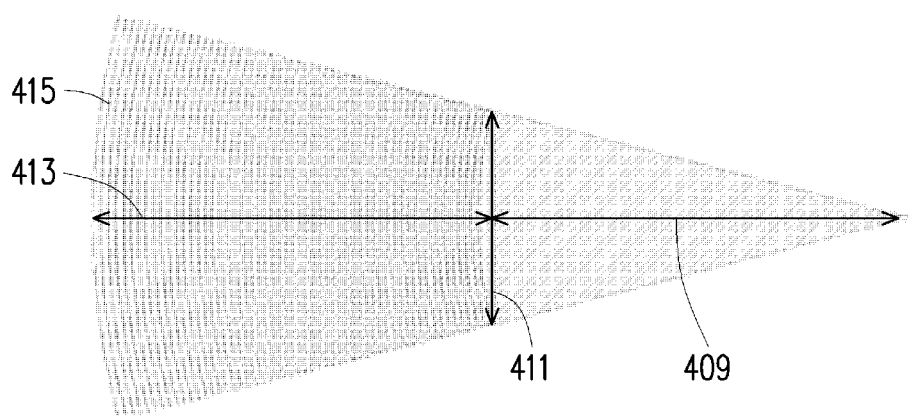
FIG. 4B illustrates a top view of a grating assembly having a taper length, width, and a grating length, in accordance with some embodiments.

In one embodiment, as illustrated in FIG. 4B, the 1D grating coupler 400 may have a taper length 409, a width 411, and a grating length 413. In some embodiments, the taper length 409, width 411, grating length 413 may be parametrized in order to optimize the mode matching according to the equation (1). In other embodiments, the period or space between grates 415 may be parametrized in order to optimize the mode matching according to the equation (1).

In some embodiments, grates 415 comprise a plurality of curved elongate scattering elements, which may be curved such that a plain wavefront travelling through a TE-polarized mode or TM-polarized of the waveguide may be phase-matched according to the equation (1) to an optical fiber positioned at the incident angle θ 407. In other embodiments, the elongate scattering elements may be at least partially elliptically shaped, at least partially oval shaped, or have another shape such as for example a hyperbolic shape, a parabolic shape, or any second order (or higher order) function. In further embodiments, the curvature of the scattering elements may be parametrized in order to optimize the mode matching according to the equation (1).

Figure 5A:
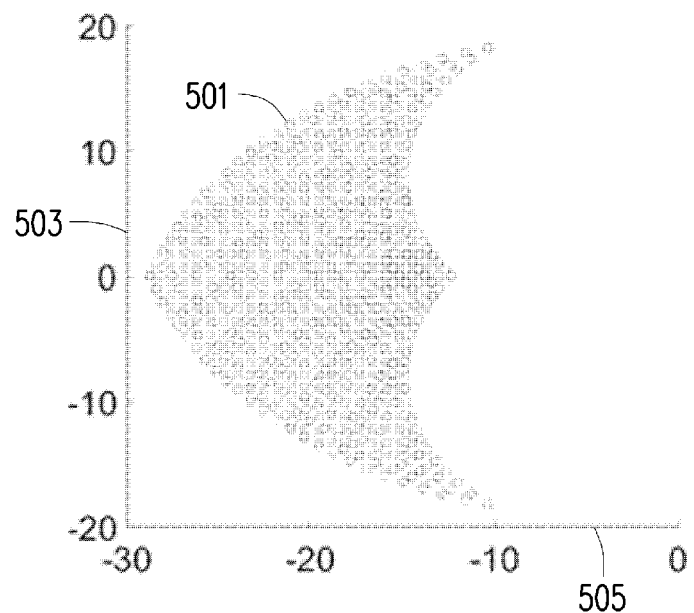
FIG. 5A illustrates a structure of 2D grating elements, in accordance with some embodiments.
Figure 5B:
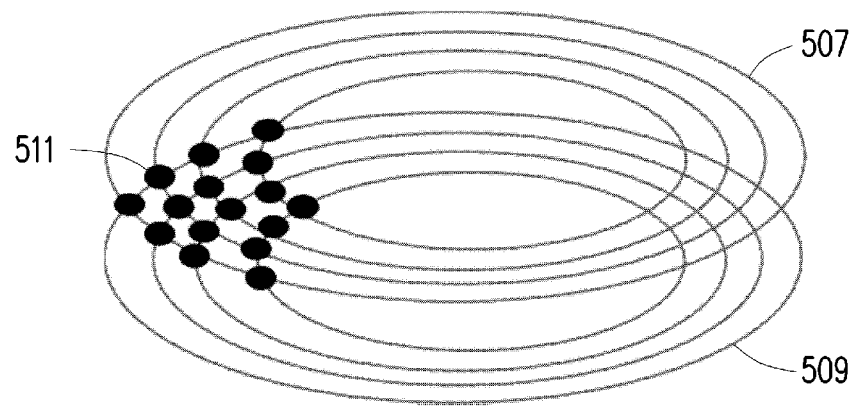
FIG. 5B illustrates intersection points of crossing ellipses that determine the structure of the 2D grating coupler, in accordance with some embodiments.

FIG. 5A shows a schematic structure of the 2D grating element 307. In some embodiments, the grating holes of or poles 501 are generated from two crossing ellipses 507 and 509 (FIG. 5B) which are crossed at cross-points 511 (FIG. 5B). In further embodiments, the two crossing ellipses 507 and 509 (FIG. 5B) are orthogonal to each other. This type of structure is helpful for improving the PDL of the 2D grating coupler 303. Moreover, a diamond-like lattice of the grating holes or poles 501 may be approximately 10 μm in a horizontal direction 505 and approximately 40 μm in a vertical direction 503.

In some embodiments, the orthogonal ellipses 507 and 509 may be generated according to the equations (2) and (3) below $$q_1 \lambda - x n_{cladding} \cos\theta - n_{eff}\sqrt{x^2+(y+\Delta)^2}=0 \quad (2)$$

$$q_2 \lambda - x n_{cladding} \cos\theta - n_{eff}\sqrt{x^2+(y-\Delta)^2}=0 \quad (3)$$

where origin is the focal point, $q_1$ ($q_1$=1, 2, 3, . . . ) is an integer for the ellipses 509 and $q_2$ ($q_2$=1, 2, 3, . . . ) is an integer for the ellipses 507, $n_{cladding}$ is the cladding refractive index, and $n_{eff}$ is the refractive index of the 2D grating coupler, θ is the incident angle of the out-of-plane optical beam (e.g., optical fiber forming θ=12° angle with respect to the grating surface), and Δ is a vertical shift. Since $n_{eff}$ may not be evaluated precisely due to process variation, Δ vertical shift parameter may be parametrized for determining an optimal geometric shape and dimensions of the diamond-like lattice of the grating holes or poles 501. On exemplary advantage of generating physical layout of the 2D grating element 307 using the two crossed ellipses is a reduction of a physical footprint on the integrated optical chip, while parametrized vertical shift may also allow for generation of any curved patterns (e.g., circle, ellipses or any second order curves) thereby reducing physical layout times.

Figure 6:
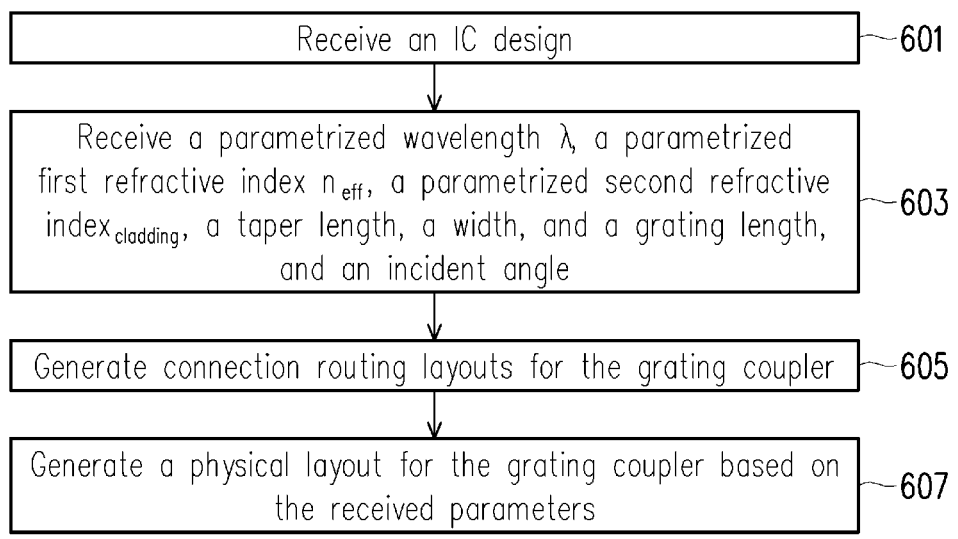
FIG. 6 illustrates a flow diagram of a method for automatically generating a physical layout of a grating coupler based on received parameters, in accordance with some embodiments.

FIG. 6 illustrates a flow diagram of a method for automatically generating a physical layout of a grating coupler based on received parameters, in accordance with some embodiments. At operation 601, an IC design may be received. In some embodiments, the IC design may comprise a source gate-level netlist describing the existing IC design. In some embodiments, the gate-level netlist may be a text file synthesized from a Register Transfer Level (RTL) source code by an RTL Compiler synthesis tool. In further embodiments, the source gate-level netlist may comprise a hierarchical or flattened gate level netlist representing the IC design. Moreover, the source gate-level netlist may include component(s) and a description of their interconnections using nets. Furthermore, the components source gate-level netlist can be reduced to combinatorial or sequential logic gates, or they may be hierarchical blocks of lower level. In some embodiments, the source gate-level netlist may be parsed into a data structure such as a directed graph with graph's vertices serving as parsed standard cells or parametrized cells (Pcells) and directed edges as inputs and outputs of the parsed standard cells or PCells.

At operation 603, parametrized wavelength λ, refractive index of a grating coupler $n_{eff}$, refractive index of cladding $n_{cladding}$, a taper length, a width, and a grating length, and an incident angle θ may be received. In accordance with some embodiments, in the case of 2D grating couplers, $q_1$ and $q_2$ integers parametrizing the number of orthogonal ellipses and the vertical Δ shift parameter may also be received.

At operation 605, after the automatic placing of the 1D or 2D grating couplers in the allocated locations of the semiconductor substrate, a routing connection for each placed grating coupler may generated. In some embodiments, the planar waveguide structures be used in generating routing connection into or out of the grating couplers integrated in the photonically-enabled chip.

At operation 607, after the routing connection for each placed grating coupler is generated, a physical layout for the grating coupler may be generated and outputted based on the received parametrized wavelength λ, refractive index of a grating coupler $n_{eff}$, refractive index of cladding $n_{cladding}$, the taper length 409, the width 411, and the grating length 413, and the incident angle θ 407. In accordance with some embodiments, in the case of 2D grating couplers, A physical layout of the diamond-like lattice of the grating holes or poles 501 may be generated based on $q_1$ and $q_2$ integers parametrizing the number of orthogonal ellipses and the vertical Δ shift parameter. In some embodiments, the dimensions of the physical layout for the parametrized grating coupler may be generated according to equations (1), (2), and (3). In further embodiments, the dimensions of physical layout for the parametrized grating coupler may be generated according to any other predefined models.

Figure 7:
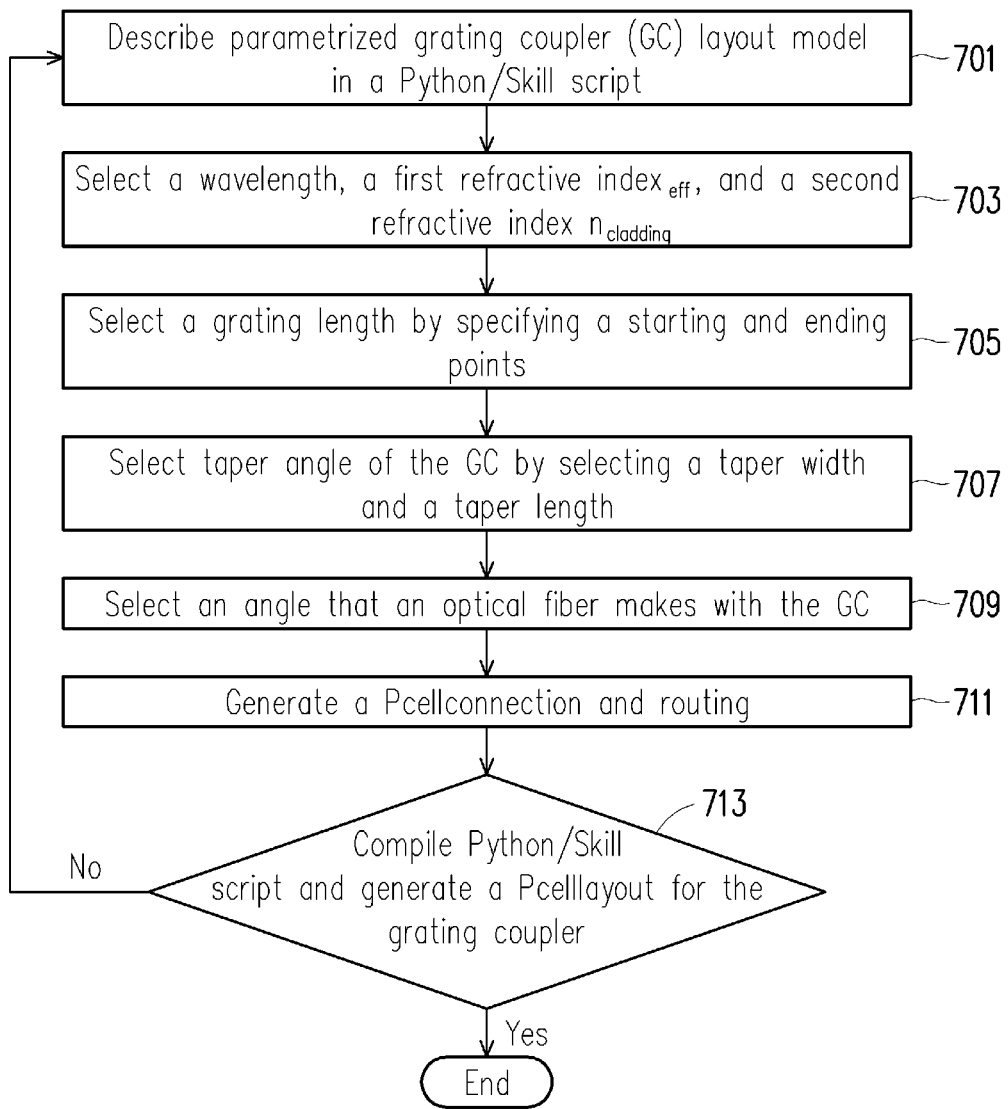
FIG. 7 illustrates a flow diagram of a method for automatically generating a physical layout of a grating coupler based on received parameters, in accordance with further embodiments.

FIG. 7 illustrates a flow diagram of a method for automatically generating a physical layout of a grating coupler based on selected parameters and layout model described in a Python or Skill script, in accordance with some embodiments. At operation 701, the predefined models of the 1D or 2D grating couplers' layouts may be described in the Python or Skill script. In some embodiments, the predefined layout models may be given by the equations (1), (2), or (3) described in the Python or Skill script.

At operation 703, a wavelength λ, refractive index of a grating coupler $n_{eff}$, and refractive index of cladding $n_{cladding}$ may be selected. In some embodiments, the wavelength λ, refractive index of a grating coupler $n_{eff}$ and refractive index of cladding $n_{cladding}$ may be selected from an input file or a graphical user interface (GUI).

At operation 705, a grating length specified by a starting and ending points may be selected. In some embodiments, the starting and ending points may be selected from the input file or the graphical user interface (GUI).

At operation 707, a taper angle of the grating coupler may be selected. In some embodiments, a taper length and a taper width may be selected that determines the taper angle. In some embodiments, the taper angle or the taper length and taper width may be selected from the input file or the graphical user interface (GUI).

At operation 709, an incident angle θ that an optical fiber makes with the grating coupler may be selected. In some embodiments, the incident angle θ may be selected from the input file or the graphical user interface (GUI).

At operation 711, a routing connection for each placed grating coupler may generated. In some embodiments, the planar waveguide structures be used in generating routing connection into or out of the grating couplers integrated in the photonically-enabled chip.

At operation 713, after the Python or Skill script describing the GC layout model is compiled successfully, a physical layout for the grating coupler may be generated and outputted based on the selected parameters. In some embodiments, if the Python or Skill script does not compile successfully or the generated physical layout violates design rule checks (DRCs), then the NO branch is taken to the operation 701. If the Python or Skill script compiles successfully or the generated physical layout passes design rule checks (DRCs), then processing illustrated in FIG. 7 terminates. If the NO branch is taken, then GC layout model and the selected parameters may be modified to pass the DRCs.

The generated physical layout of the grating coupler can be used to complete and manufacture the photonically-enabled integrated circuit using a semiconductor fabrication process. The physical layout, often referred to as "geometry," may be used to generate the integrated circuit tooling, which is a series of masks, each representing a layer for the integrated circuit. The tooling is then used by manufacturers to fabricate the photonically-enabled integrated circuit.

While various embodiments of the present disclosure have been described above, it should be understood that they have been presented by way of example only, and not by way of limitation. Likewise, the various diagrams may depict an example architectural or configuration, which are provided to enable persons of ordinary skill in the art to understand exemplary features and functions of the present disclosure. Such persons would understand, however, that the present disclosure is not restricted to the illustrated example architectures or configurations, but can be implemented using a variety of alternative architectures and configurations. Additionally, as would be understood by persons of ordinary skill in the art, one or more features of one embodiment can be combined with one or more features of another embodiment described herein. Thus, the breadth and scope of the present disclosure should not be limited by any of the above-described exemplary embodiments.

It is also understood that any reference to an element herein using a designation such as "first," "second," and so forth does not generally limit the quantity or order of those elements. Rather, these designations are used herein as a convenient means of distinguishing between two or more elements or instances of an element. Thus, a reference to first and second elements does not mean that only two elements can be employed, or that the first element must precede the second element in some manner.

Additionally, a person having ordinary skill in the art would understand that information and signals can be represented using any of a variety of different technologies and techniques. For example, data, instructions, commands, information, signals, bits and symbols, for example, which may be referenced in the above description can be represented by voltages, currents, electromagnetic waves, magnetic fields or particles, optical fields or particles, or any combination thereof A person of ordinary skill in the art would further appreciate that any of the various illustrative logical blocks, modules, processors, means, circuits, methods and functions described in connection with the aspects disclosed herein can be implemented by electronic hardware (e.g., a digital implementation, an analog implementation, or a combination of the two), firmware, various forms of program or design code incorporating instructions (which can be referred to herein, for convenience, as "software" or a "software module), or any combination of these techniques.

To clearly illustrate this interchangeability of hardware, firmware and software, various illustrative components, blocks, modules, circuits, and steps have been described above generally in terms of their functionality. Whether such functionality is implemented as hardware, firmware or software, or a combination of these techniques, depends upon the particular application and design constraints imposed on the overall system. Skilled artisans can implement the described functionality in various ways for each particular application, but such implementation decisions do not cause a departure from the scope of the present disclosure. In accordance with various embodiments, a processor, device, component, circuit, structure, machine, module, etc. can be configured to perform one or more of the functions described herein. The term "configured to" or "configured for" as used herein with respect to a specified operation or function refers to a processor, device, component, circuit, structure, machine, module, signal, etc. that is physically constructed, programmed, arranged and/or formatted to perform the specified operation or function.

Furthermore, a person of ordinary skill in the art would understand that various illustrative logical blocks, modules, devices, components and circuits described herein can be implemented within or performed by an integrated circuit (IC) that can include a digital signal processor (DSP), an application specific integrated circuit (ASIC), a field programmable gate array (FPGA) or other programmable logic device, or any combination thereof. The logical blocks, modules, and circuits can further include antennas and/or transceivers to communicate with various components within the network or within the device. A processor programmed to perform the functions herein will become a specially programmed, or special-purpose processor, and can be implemented as a combination of computing devices, e.g., a combination of a DSP and a microprocessor, a plurality of microprocessors, one or more microprocessors in conjunction with a DSP core, or any other suitable configuration to perform the functions described herein.

If implemented in software, the functions can be stored as one or more instructions or code on a computer-readable medium. Thus, the steps of a method or algorithm disclosed herein can be implemented as software stored on a computer-readable medium. Computer-readable media includes both computer storage media and communication media including any medium that can be enabled to transfer a computer program or code from one place to another. A storage media can be any available media that can be accessed by a computer. By way of example, and not limitation, such computer-readable media can include RAM, ROM, EEPROM, CD-ROM or other optical disk storage, magnetic disk storage or other magnetic storage devices, or any other medium that can be used to store desired program code in the form of instructions or data structures and that can be accessed by a computer.

In this document, the term "module" as used herein, refers to software, firmware, hardware, and any combination of these elements for performing the associated functions described herein. Additionally, for purpose of discussion, the various modules are described as discrete modules; however, as would be apparent to one of ordinary skill in the art, two or more modules may be combined to form a single module that performs the associated functions according embodiments of the present disclosure.

Various modifications to the implementations described in this disclosure will be readily apparent to those skilled in the art, and the general principles defined herein can be applied to other implementations without departing from the scope of this disclosure. Thus, the disclosure is not intended to be limited to the implementations shown herein, but is to be accorded the broadest scope consistent with the novel features and principles disclosed herein.

What is claimed is:

1. A method for generating a physical layout for a grating coupler integrated in a photonically-enabled circuit comprising:
   receiving a photonically-enabled integrated circuit design;
   receiving a parametrized wavelength of an optical beam, a parametrized first refractive index of the grating coupler, and a parametrized second refractive index of a cladding layer;
   receiving a parametrized taper length of the grating coupler, a parametrized width of the grating coupler, a parametrized grating length of the grating coupler, and a parametrized incident angle of the optical beam incident onto the grating coupler;
   generating a connection routing layout for the grating coupler placed on the semiconductor substrate;
   generating a physical layout for the grating coupler based on the received parametrized wavelength, the parametrized first refractive index, the parametrized second refractive index, the parametrized taper length, the parametrized width, the parametrized grating length, and the parametrized incident angle, wherein the generating of the physical layout is according to a predefined model; and
   outputting the physical layout of the grating coupler for manufacturing under a semiconductor fabrication process.

2. The method of claim 1, wherein the grating coupler is a two dimensional grating coupler that simultaneously couples two polarization components of the incident optical beam with two integrated waveguides.

3. The method of claim 2, wherein the physical layout of the grating coupler comprises a lattice of grating holes generated from an intersection of two orthogonal and co-centric ellipses that are vertically shifted.

4. The method of claim 3, wherein a geometric shape of the lattice of the grating holes is determined by a vertical shift parameter and number of intersecting ellipses.

5. The method of claim 1, wherein the grating coupler is a one dimensional coupler having a plurality of grating elements separated according to a period that is determined by the predefined layout model and configured to couple the incident optical beam with an integrated waveguide.

6. A non-transitory machine-readable medium storing instructions that when executed by a processor performs a method for generating a physical layout for a grating coupler integrated in a photonically-enabled circuit, the method comprising:
   receiving a photonically-enabled integrated circuit design;
   receiving a parametrized wavelength of an optical beam, a parametrized first refractive index of the grating coupler, and a parametrized second refractive index of a cladding layer;
   receiving a parametrized taper length of the grating coupler, a parametrized width of the grating coupler, a parametrized grating length of the grating coupler, and a parametrized incident angle of the optical beam incident onto the grating coupler;
   generating connection routing layouts for the grating coupler placed on the semiconductor substrate;
   generating a physical layout for the grating coupler based on the received parametrized wavelength, the parametrized first refractive index, the parametrized second refractive index, the parametrized taper length, the parametrized width, the parametrized grating length, and the parametrized incident angle, wherein the generating of the physical layout is according to a predefined model; and
   outputting the physical layout of the grating coupler for manufacturing under a semiconductor fabrication process.

7. The non-transitory machine-readable medium of claim 6, wherein the grating coupler is a two dimensional grating coupler that simultaneously couples two polarization components of the incident optical beam with two integrated waveguides.

8. The non-transitory machine-readable medium of claim 7, wherein the physical layout of the two dimensional grating coupler comprises a lattice of grating holes generated from an intersection of two orthogonal and co-centric ellipses that are vertically shifted.

9. The non-transitory machine-readable medium of claim 8, wherein a geometric shape of the lattice of the grating holes is determined by a vertical shift parameter and number of intersecting ellipses.

10. The non-transitory machine-readable medium of claim 6, wherein the grating coupler is a one dimensional coupler having a plurality of grating elements separated according to a period that is determined by the predefined layout model and configured to couple the incident optical beam with an integrated waveguide.

11. The non-transitory machine-readable medium of claim 10, wherein the plurality of grating elements are elliptically shaped with progressively increasing widths.

12. An integrated circuit design system comprising:
   a computer having a processor and memory;
   a software application, run by the computer processor, and residing in the computer memory;
   the software application comprising a plurality of software modules comprising:
   a place and route module configured to receive a photonically-enabled integrated circuit design and to place a grating coupler of the received photonically-enabled integrated circuit design in an allocated location on a semiconductor substrate;
   a physical layout generation module coupled to a predefined layout model and configured to:
   receive a parametrized wavelength of an optical beam, a parametrized first refractive index of the grating coupler, and a parametrized second refractive index of a cladding layer;
   receive a parametrized taper length of the grating coupler, a parametrized width of the grating coupler, a parametrized grating length of the grating coupler, and a parametrized incident angle of the optical beam incident onto the grating coupler;
   generate a physical layout for the grating coupler based on the received parametrized wavelength, the parametrized first refractive index, the parametrized second refractive index, the parametrized taper length, the parametrized width, the parametrized grating length, and the parametrized incident angle and the predefined model; and
   a routing module configured to output a physical layout of the photonically-enabled integrated circuit design for manufacturing under a semiconductor fabrication process.

13. The integrated circuit design system of claim 12, wherein the place and route module is further configured to generate a connection routing layout for connecting the grating coupler placed on the semiconductor substrate to an optical modulator.

14. The integrated circuit design system of claim 12, wherein the grating coupler is a two dimensional grating coupler that simultaneously couples two polarization components of the incident optical beam with two integrated waveguides.

15. The integrated circuit design system of claim 14, wherein the physical layout of the grating coupler comprises a lattice of grating holes generated from an intersection of two orthogonal and co-centric ellipses that are vertically shifted.

16. The integrated circuit design system of claim 15, wherein the physical layout generation module is further configured to determine a geometric shape of the lattice of the grating holes based on a vertical shift parameter and number of intersecting ellipses.

17. The integrated circuit design system of claim 15, wherein the grating holes are octagonal and configured to separate orthogonal polarization components of the incident optical beam.

18. The integrated circuit design system of claim 15, the physical layout generation module is further configured to receive a parametrized curvature of the co-centric ellipses.

19. The integrated circuit design system of claim 12, wherein the grating coupler is a one dimensional coupler having a plurality of grating elements separated according to a period that is determined by the predefined layout model and configured to couple the incident optical beam with an integrated waveguide.

20. The integrated circuit design system of claim 19, wherein the plurality of grating elements are elliptically shaped with progressively increasing widths.

* * * * *